(12) United States Patent
Waldrop et al.

(10) Patent No.: US 11,145,353 B1
(45) Date of Patent: Oct. 12, 2021

(54) CENTRALIZED DFE RESET GENERATOR FOR A MEMORY DEVICE

(71) Applicant: MICRON TECHNOLOGY, INC., Boise, ID (US)

(72) Inventors: William Chad Waldrop, Allen, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/844,182

(22) Filed: Apr. 9, 2020

(51) Int. Cl.
| | |
|---|---|
| *G11C 7/10* | (2006.01) |
| *G11C 11/4076* | (2006.01) |
| *G11C 11/4093* | (2006.01) |
| *G11C 11/4096* | (2006.01) |
| *H04L 25/03* | (2006.01) |

(52) U.S. Cl.
CPC ...... *G11C 11/4076* (2013.01); *G11C 11/4093* (2013.01); *G11C 11/4096* (2013.01); *H04L 25/03267* (2013.01)

(58) Field of Classification Search
CPC .................................................. G11C 7/1093
USPC ........................................................ 365/193
See application file for complete search history.

(56) References Cited

U.S. PATENT DOCUMENTS

| | | | |
|---|---|---|---|
| 10,198,200 B1* | 2/2019 | DeSimone | G06F 3/0673 |
| 10,291,439 B1* | 5/2019 | Taylor | G11C 7/1048 |
| 2007/0214335 A1* | 9/2007 | Bellows | G11C 7/1051 |
| | | | 711/167 |
| 2019/0158082 A1* | 5/2019 | Lee | G11C 8/10 |

* cited by examiner

*Primary Examiner* — Min Huang
(74) *Attorney, Agent, or Firm* — Fletcher Yoder, P.C.

(57) ABSTRACT

Systems and methods are provided that include an interamble data strobe (DQS) counter configured to count cycles between write operations. The interamble DQS counter includes a decision feedback equalizer (DFE) reset mask circuit configured to generate a DFE reset enable signal and a DFE reset timing generator configured to generate timing signals for the DFE reset. The systems and methods also include a DFE reset generator configured to receive the DFE reset enable signal and the timing signals from the interamble DQS counter, to use the DFE reset enable signal and the timing signals to generate DFE reset signals for a plurality of DQS phases; and to transmit the DFE reset signals to the plurality of DQS phases.

19 Claims, 8 Drawing Sheets

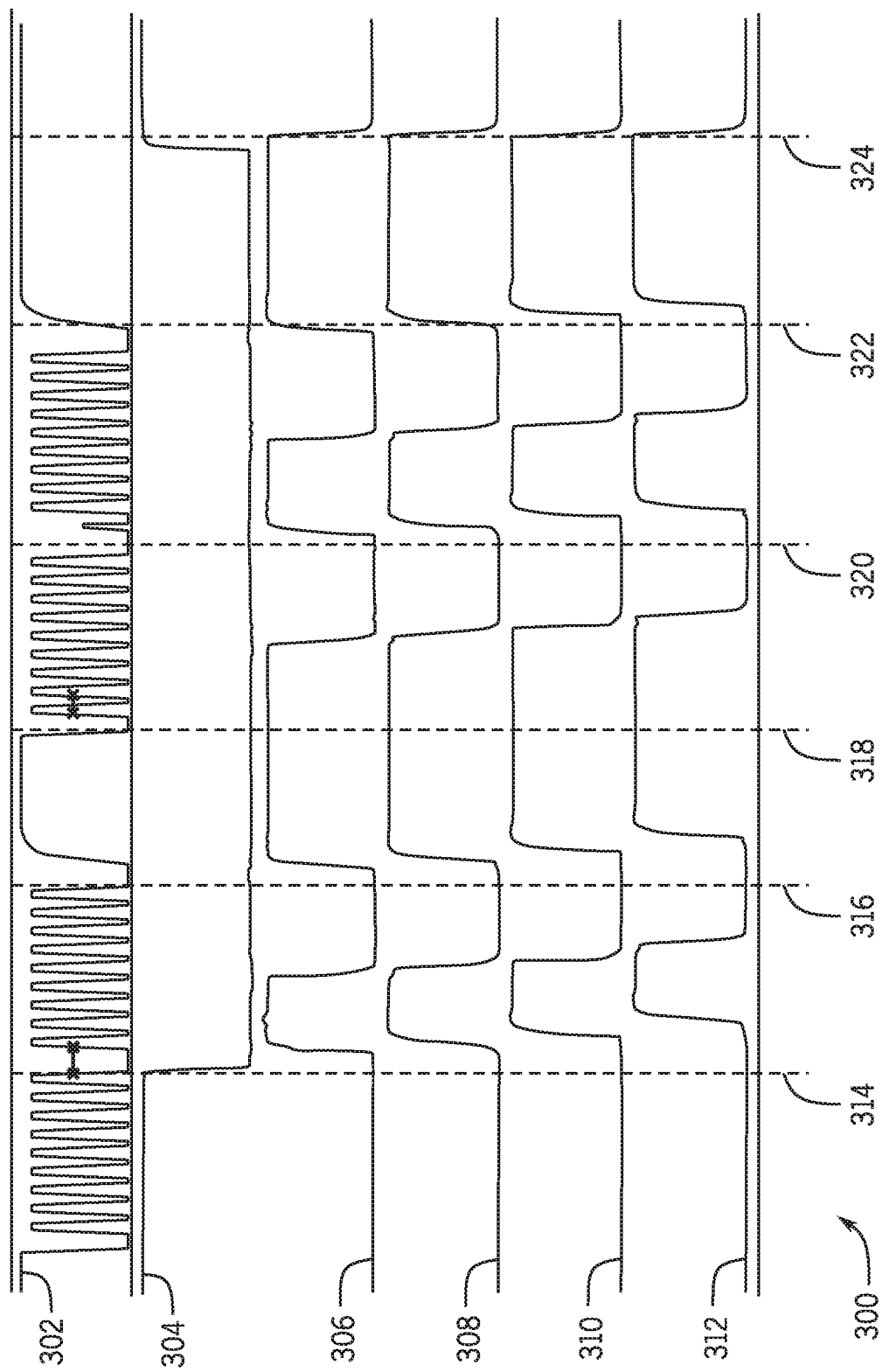

CENTRALIZED DFE RESET GENERATOR FOR A MEMORY DEVICE

BACKGROUND

Field of the Present Disclosure

Embodiments of the present disclosure relate generally to the field of Decision Feedback Equalizers (DFEs) for memory devices. More specifically, embodiments of the present disclosure relate to resetting the taps of the DFE using a centralized DFE reset generator.

Description of Related Art

Semiconductor devices (e.g., memory devices) utilize timing with phase shifts of data signals, data strobes, and/or other signals to perform operations (e.g., write operations). A DFE may be used to maintain a buffer of a number (e.g., 4) of preceding data bits to improve accuracy in interpreting whether a current bit is high or low. For example, if the DFE has 4 previous low data bits stored, then a data line (DQ) will be at a lower voltage level, and the current data bit is to be interpreted as a logical high or a low relative to that level. These multi-tap DFE input buffers are used to allow resolution of smaller external data eyes. However, including DFE reset generators in each DQ may consume die space and/or power for the memory device.

Embodiments of the present disclosure may be directed to one or more of the problems set forth above.

BRIEF DESCRIPTION OF DRAWINGS

FIG. 8 is a timing diagram that may be used by the memory device of FIG. 1 showing the DFE reset signals from the DFE reset generator, in accordance with an embodiment.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A decision feedback equalizer (DFE) may utilize a DFE buffer to track previous data levels to interpret incoming data levels. Between write operations, this DFE buffer may be reset to an initial state (e.g., all high or low values) in the DFE buffer using DFE reset circuitry. Furthermore, the DFE reset circuitry may be centralized rather than distributed within each data (DQ) line in a parallelizer. Using the centralized DFE reset circuitry, a DFE reset may be generated centrally for a number of bits (e.g., once per byte) to save power and die size consumed by the DFE reset circuitry over memory devices that utilize localized DFE reset generators in multiple phases of multiple DQs.

Figure 1:
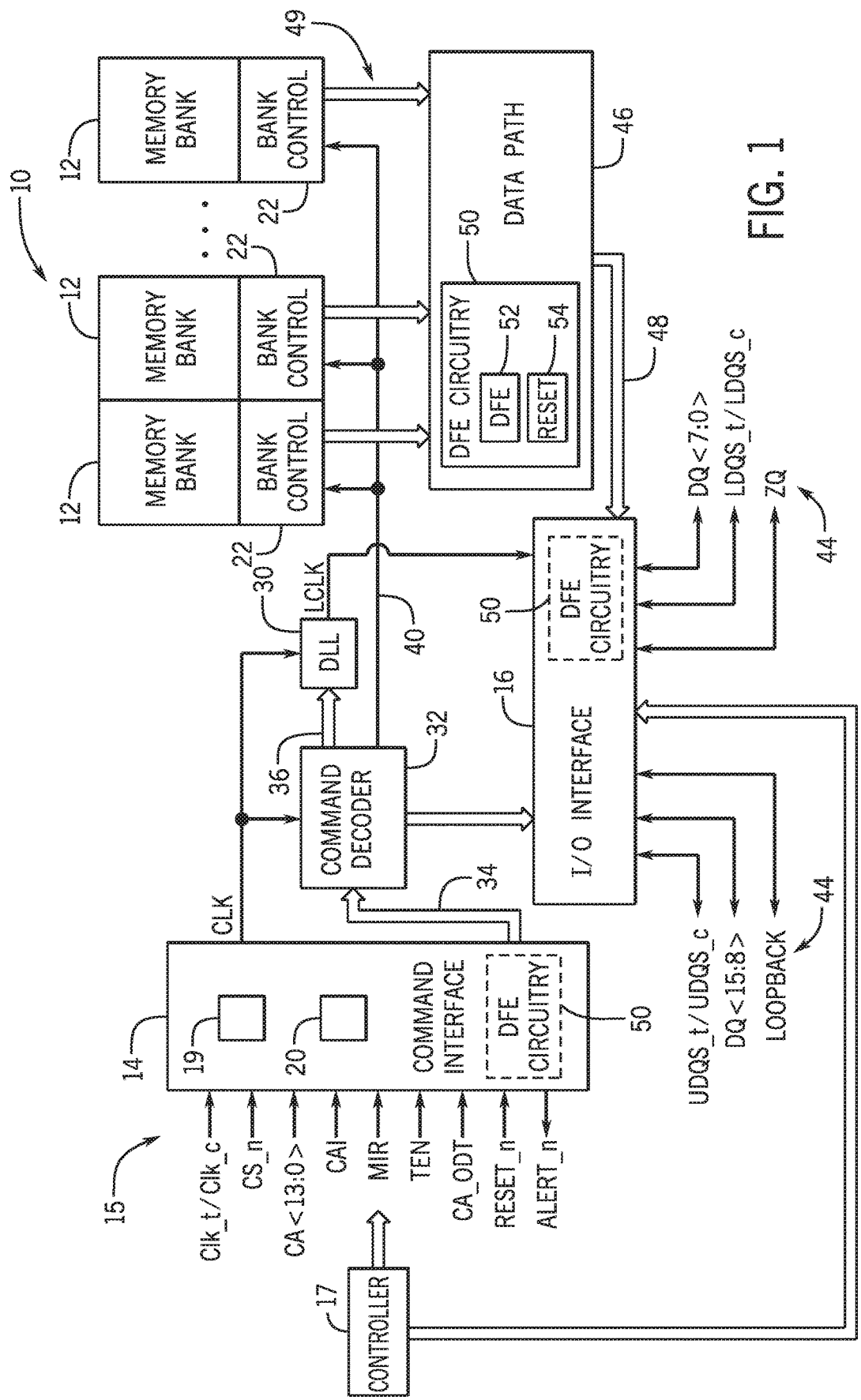
FIG. 1 is a simplified block diagram illustrating certain features of a memory device having a decision feedback equalizer (DFE) circuitry that includes a DFE that determines a level for data received by the memory device and includes DFE reset circuitry, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a processor or controller 17. The processor or controller 17 may provide various signals 15 (including the DQ signals) to the memory device 10 to facilitate the transmission and receipt of data to be written to or read from the memory device 10.

As will be appreciated, the command interface 14 may include a number of circuits, such as a clock input circuit 19 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes multiple bi-directional data buses. Data TO signals, generally referred to as DQ signals, are generally transmitted and received in one or more bi-directional data buses. The datapath 46 may convert the DQ signals from a serial bus 48 to a parallel bus 49.

For certain memory devices, such as a DDR5 SDRAM memory device, the TO signals may be divided into upper and lower bytes. For instance, for a x16 memory device, the IO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS signals are driven by the controller 17 to the memory device 10 to strobe in write data. When the write operation is complete, the controller 17 will stop driving the DQS and allow it to float to an indeterminate tri-state condition. When the DQS signal is no longer driven by the controller 17, the external DQS signal from the controller 17 to the memory device 10 will be at an unknown/indeterminate state. This state can cause undesirable behavior inside the memory device 10 because an internal DQS signal inside the memory device 10 may be at an intermediate level and/or may oscillate. In some embodiments, even the external DQS signal may ring at the I/O interface 16 when the controller 17 stops driving the external DQS signal.

The DDR5 specification may include a short postamble period where the external DQS signal is still driven by the controller 17 after the last write data bit to allow time for disabling of write circuitry to propagate before the controller 17 ceases to drive the external DQS signal. The DDR5 specification may define a short (e.g., 0.5 tCK) postamble period and a long (e.g., 1.5 tCK) postamble period that may be selected using a mode register. However, the short postamble period may provide a short period of time to reset a DFE buffer.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

DDR5 allows write operations to be performed consecutively such that data entry is gapless between two consecutive writes. In this case, the normal postamble for the first write operation and/or the normal preamble for the second write operation may be completely eliminated. For some consecutive write operations, there may be cycle gaps having a certain gap (e.g., 1, 2, 3, or more cycles) between the data burst of the first write operation and the data burst of the second write operation. For these cases, there may be a specified partial postamble and/or partial preamble to support these operations.

In some consecutive write operations, the spacing between the first write operation and the second write operation is such that the entire first postamble and second preamble is met and there may even be additional clock cycles in between the two write operations. When there are additional clock cycles in between the first postamble and second preamble, the DQS strobe may be disabled (float) or driven depending on the specification. Thus, the DFE circuitry 50 may reset the DFE 52 at the end of a write burst using reset circuitry when sufficient time to reset occurs between write operations, but the reset may be at least partially suppressed when there is insufficient time (e.g., less than 2 DQS cycles) between write operations. As noted below, when the DFE reset is suppressed at the end of a write burst, the DFE buffer may instead be populated using data strobed in using the available DQS cycles. For example, in a suppression of a reset of a 4-bit DFE buffer when 2 DQS cycles occur between write operations, 4 bits (on rising and falling edges of the DQS cycles) of "not live" data existing on the data line may be written into the DFE buffer. Moreover, in a suppression of a reset of a 4-bit DFE buffer when only a single cycle occurs between write operations, 2 bits (on rising and falling edges of the DQS cycle) may be written into the DFE buffer even though the buffer may only be halfway overwritten with "not live" data.

The datapath 46, the I/O interface 16, and/or the command interface 14 may include decision feedback engine (DFE) circuitry 50 that uses a DFE 52 that includes an input buffer of a number (e.g., 4) of previous bits (e.g., high or low) that may be used to interpret incoming data bits in data IO signals, generally referred to as DQ signals. The DFE circuitry 50 uses the previous levels in the DQ signals to increase accuracy of interpreting incoming bits in the DQ signals. The DFE input buffer depends upon tracking the previous input history on the channel to decide which input tap to use for a next data input. For gapless writes or writes spaced with a toggling interamble between the writes due to insufficient time to complete the interamble (e.g., postamble from an earlier write of consecutive writes and a pre-amble from a later write of the consecutive writes) or a defined toggling, the DFE 52 may continuously update and track every data bit on the channel. For writes spaced far enough apart that they have a non-toggling interamble, the DFE 52 will not update during the non-toggling time between writes, and its registers will become invalid for use in collecting the first data bits after the interamble. In some embodiments, the non-toggling interamble may occur when a specified toggling has occurred between writes or may be specified as containing no toggles. In some embodiments, a specification for the memory device 10 may define that a non-toggling interamble is held to a specified value (e.g., data high) so that the channel history can be known by the memory device 10 even though the channel history is not being collected by the memory device 10. The memory device 10 may update the DFE history to the value without data collection during the non-toggling portion of the interamble by using a reset of the DFE 52 to make the registers reset to a specified (e.g., all high data) state.

The DFE circuitry 50 includes DFE reset circuitry 54 to perform the reset of the DFE 52. However, as previously noted, when an insufficient duration for a reset occurs between commands, the DFE circuitry 50 may not begin/complete the reset. Accordingly, the DFE circuitry 50 may selectively disable/enable the DFE reset based at least in part on the duration between the commands.

Figure 2:
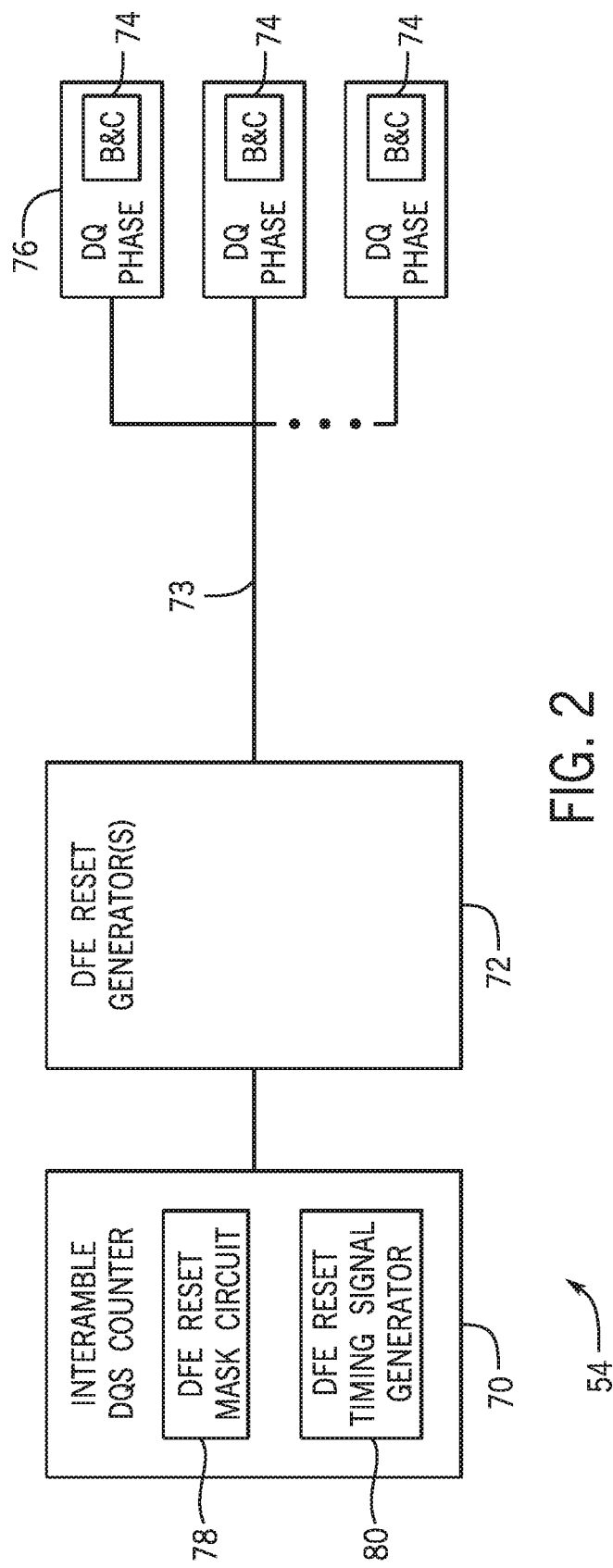
FIG. 2 is a schematic diagram of the DFE reset circuitry of FIG. 1 including a DFE reset mask that controls when a DFE reset is enabled, a DFE reset timing signal generator that controls timing of the reset, and a DFE reset generator that uses the DFE reset enable signal and the timing signals to generate DFE reset signals and distribute the DFE reset signals to DQ phases, in accordance with an embodiment.

FIG. 2 is a schematic diagram of an embodiment of the DFE reset circuitry 54. The DFE reset circuitry 54 utilizes a centralized scheme to generate DFE reset signals quicker than generating by deriving reset signals using local DS clocking in a portion of the phases of each DQ. Instead, the DFE reset circuitry 54 generates a DFE reset pulse that may be used for all phases (e.g., four phases) and is derived directly from an interamble DQS counter 70 that is a faster relative time domain than a data loading signal time domain that may be used in memory devices using the local DS clocking mentioned above. The interamble DQS counter 70 may be used to block spurious data strobe signals that may be generated in an unknown DQS region after a write postamble of a write operation and prior to a write preamble of a subsequent write operation. The interamble DQS counter 70 effectively justifies the DQS clocking so that all downstream clocks after the filter are known to be legitimate clocks and not glitches caused by the external DQS/DQSF pins being in unknown states. For example, the interamble DQS counter 70 may be any suitable interamble circuitry, such as the interamble circuitry of U.S. patent application Ser. No. 16/834,409, entitled Write Interamble Filtering and filed on Mar. 30, 2020.

The interamble DQS counter 70 sends control signals to one or more DFE reset generator(s) 72 that uses the control signals to output a DFE reset signal 73 to buffer and chop (BC) circuitry 74 in each DQ phase 76 allocated to the DFE reset signal 73. For instance, eight DQ phases 76 (e.g., 4 phases with a copy for each of the upper and lower bits) may be allocated to the DFE reset signal 73. For instance, this number of DQ phases 76 may be half (e.g., 1 byte) of a prefetch (e.g., 16 bits) for the memory device 10.

As illustrated, the interamble DQS counter 70 may include a DFE reset mask circuit 78 that may be used to control whether the DFE reset generator 72 is enabled to reset the DFEs 52. By locating the DFE reset mask circuit 78 in the interamble DQS counter 70, per DFE reset signal 73, die area and power consumption may be reduced for the memory device 10 when compared to memory devices that include a DFE reset mask circuit 78 in each DQ path. The interamble DQS counter 70 further includes a DFE reset timing signal generator 80 that is used to send timing signals to control operation of the DFE reset generator 72.

Figure 3:
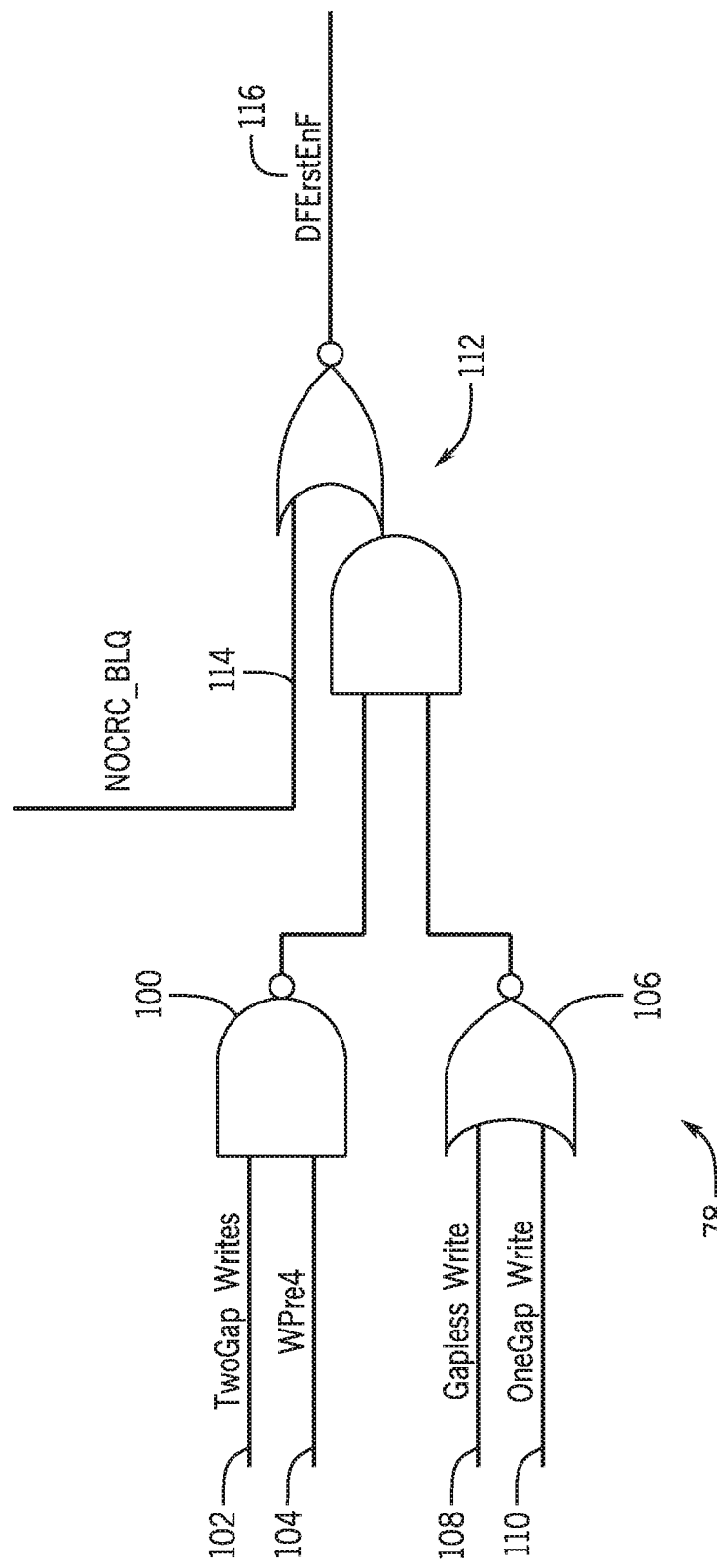
FIG. 3 is a schematic diagram of the DFE reset mask of FIG. 2 that generates a DFE reset enable signal to selectively enable a DFE reset, in accordance with an embodiment.

FIG. 3 is a schematic diagram of an embodiment of the DFE reset mask circuit 78. As illustrated, the DFE reset mask circuit 78 includes a NAND gate 100 that receives a TwoGapWrites signal 102 that indicates whether two clock cycles exist between write operations. The NAND gate 100 also receives a WPre4 signal 104. The WPre4 signal 104 indicates that the memory device 10 is set to a longer write preamble mode (e.g., a write preamble of 4) than the shorter programmable modes of other write preambles (e.g., write preambles of 2 or 3). The longer write preamble has one more DQS toggle than the shorter write preambles, so consecutive writes can be spaced by one more cycle in WPRE=4 and have a fully toggling write interamble.

The DFE reset mask circuit 78 also includes a NOR gate 106 that receives a GaplessWrite signal 108 and OneGapWrite signal 110. The GaplessWrite signal 108 indicates that no clock cycles exist between consecutive write operations, and the OneGapWrite signal 110 indicates that a single clock signal exists between consecutive write operations.

Outputs from the NAND gates 100 and the NOR gate 106 are transmitted to a multiplexer 112 that along with a burst chop signal 114 is used to control output of a DFE reset enable signal 116. The chop signal 114 may be a burst chop signal 114 that indicates that a corresponding write operation uses less (e.g., 8 bits) than a complete prefetch (e.g., 16 bits) of the memory device 10 indicating that the write operation inherently will have sufficient cycles after the write to reset the DFE 52. The DFE reset enable signal 116 is transmitted from the DFE reset mask circuit 78 to the DFE reset generator 72 to control whether the DFE resetting is enabled.

Figure 4:
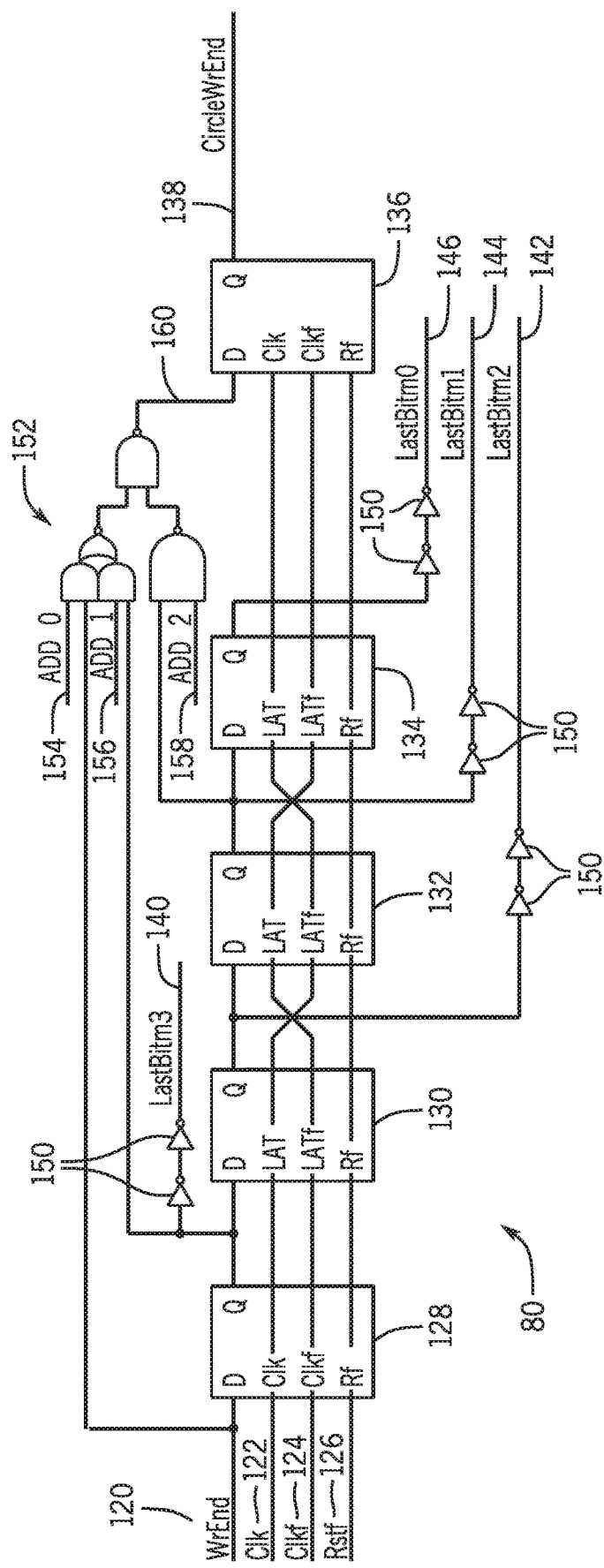
FIG. 4 is a schematic diagram of the DFE reset timing generator of FIG. 2 that generates timing signals for the DFE reset, in accordance with an embodiment.

FIG. 4 is a schematic diagram of an embodiment of the DFE reset timing signal generator 80. As illustrated, the DFE reset timing signal generator 80 receives a write end signal 120, a clock 122, a complementary clock 124, and a reset signal 126. The write end signal 120 indicates an end of a write operation. The clock 122 and the complementary clock 124 may be complementary system or local clocks used to control toggling of flip-flops 128, 130, 132, 134, and 136 that are used to buffer the write end signal 120 to generate a CircleWrEnd signal 138 indicative that the write end signal 120 has passed through a set number of flip-flops in the DFE reset timing signal generator 80. The flip-flops 128, 130, 132, and 134 respectively output signals LastBitm3 140, LastBitm2 142, LastBitm1 144, and LastBitm0 146, wherein LastBitm0 146 is the last bit minus zero cycles, LastBitm1 144 is the last bit minus one cycle, LastBitm2 142 is the last bit minus two clock cycles, and LastBitm3 is the last bit minus three clock cycles. In some embodiments, the output signals LastBitm3 140, LastBitm2 142, LastBitm1 144, and LastBitm0 146 may utilize one or more inverters 150 to amplify the signals for transmission to other portions of the memory device 10 and/or invert the signals to obtain appropriate logical values.

The write end signal 120 and the output of the flip-flops 128 and 132 are transmitted to a multiplexer 152 that selects between the signals using an Add0 signal 154, an Add1 signal 156, and an Add2 signal 158 that control how many flip-flops are included in transmission of an input 160 to control how many clock signals are added to the write end signal 120 before transmission to the flip-flop 136 to output the CircleWrEnd signal 138.

Figure 5:
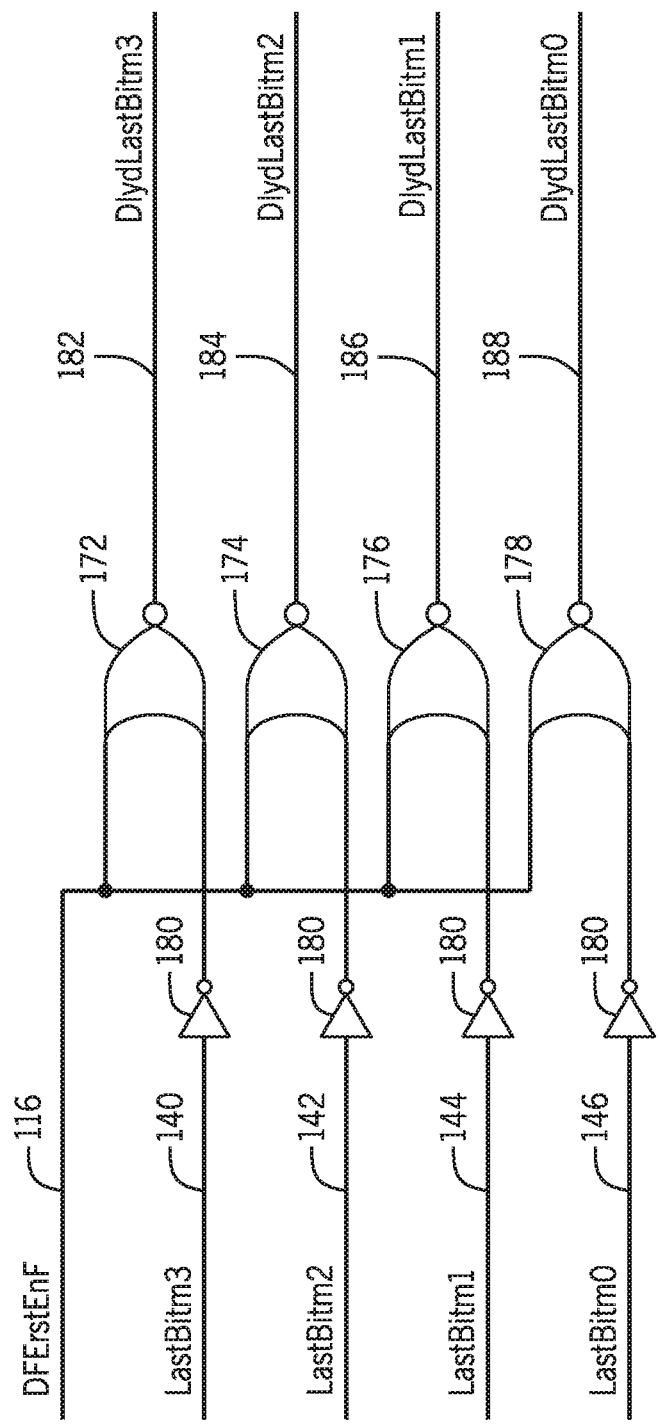
FIG. 5 is a schematic diagram of a DFE reset timing and suppression circuit that suppresses the DFE reset timing signals from FIG. 4 when the DFE reset mask signal is active, in accordance with an embodiment.

FIG. 5 is a schematic diagram of an embodiment of a DFE reset timing and suppression circuit 170 used to delay the output signals LastBitm3 140, LastBitm2 142, LastBitm1 144, and LastBitm0 146 from the DFE reset timing signal generator 80. The DFE reset timing and suppression circuit 170 may be disposed in the DFE reset generator 72 or in another location within the DFE reset circuitry 54. The output signals LastBitm3 140, LastBitm2 142, LastBitm1 144, and LastBitm0 146 are gated using respective NOR gates 172, 174, 176, and 178 that selectively enables the respective output signals LastBitm3 140, LastBitm2 142, LastBitm1 144, and LastBitm0 146 based on a value of the DFE reset enable signal 116. Specifically, the output signals LastBitm3 140, LastBitm2 142, LastBitm1 144, and LastBitm0 146 are selectively gated with the DFE reset enable signal 116 to either enable or disable the generation of the respective output signals DlydLastBitm3 182, DlydLastBitm2 184, DlydLastBitm1 186, and DlydLastBitm0 188.

Figure 6:
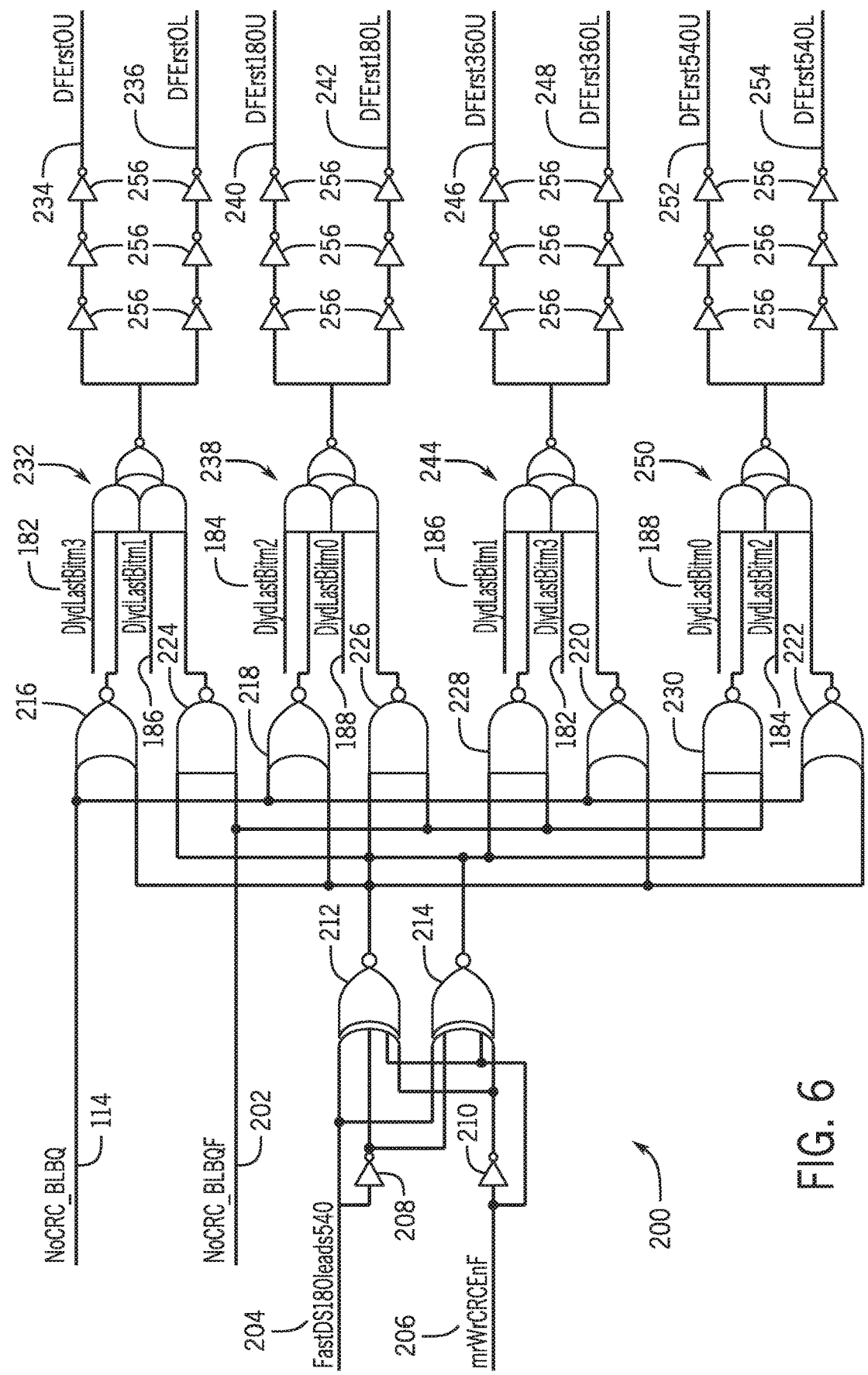
FIG. 6 is a schematic diagram of a DFE reset generator that uses the delayed timing signals from the timing circuit of FIG. 5 to generate the DFE reset signals, in accordance with an embodiment.

FIG. 6 is a schematic diagram of an embodiment of a reset generator 200 that may be part of the DFE reset generator 72. As illustrated, the reset generator 200 receives the burst chop signal 114 and a complementary chop signal 202 that is complementary to the burst chop signal 114. The reset generator 200 also receives a FastDS180leads540 signal 204 that indicates which phase of the DQS is received first for the respective write operation. The reset generator 200 further receives a CRC enable signal 206 that indicates whether CRC is enabled for the write operation. The FastDS180leads540 signal 204 and the CRC enable signal 206 are inverted using inverters 208 and 210 with the inverted and non-inverted FastDS180leads540 signal 204 and the CRC enable signal 206 each supplied to exclusive OR (XOR) gates 212 and 214. The output of the XOR gate 212 is transmitted to NOR gates 216, 218, 220, and 222. The NOR gates 216, 218, 220, and 222 also receive the burst chop signal 114. The output of the XOR gate 214 is transmitted to NAND gates 224, 226, 228, and 230. The NAND gates 224, 226, 228, and 230 also receive the complementary chop signal 202.

The outputs of the NOR gate 216 and the NAND gate 224 are transmitted to a multiplexer 232. The multiplexer 232 uses the DlydLastBitm3 182 and the DlydLastBitm1 186 to control output of the multiplexer 232 as a DFErst0U 234 and a DFErst0L 236.

The outputs of the NOR gate 218 and the NAND gate 226 are transmitted to a multiplexer 238. The multiplexer 238 uses the DlydLastBitm2 184 and the DlydLastBitm0 188 to control output of the multiplexer 238 as a DFErst180U 240 and a DFErst180L 242.

The outputs of the NOR gate 220 and the NAND gate 228 are transmitted to a multiplexer 244. The multiplexer 244 uses the DlydLastBitm3 182 and the DlydLastBitm1 186 to control output of the multiplexer 244 as a DFErst360U 246 and a DFErst360L 248.

The outputs of the NOR gate 222 and the NAND gate 230 are transmitted to a multiplexer 250. The multiplexer 250 uses the DlydLastBitm2 184 and the DlydLastBitm0 188 to control output of the multiplexer 250 as a DFErst540U 252 and a DFErst540L 254.

In some embodiments, the DFErst0U 234, the DFErst0L 236, the DFErst180U 240, the DFErst180L 242, the DFErst360U 246, the DFErst360L 248, the DFErst540U 252, and the DFErst540L 254 may utilize one or more inverter/amplifiers 256 to control voltage amplitudes and/or logic of the DFErst0U 234, the DFErst0L 236, the DFErst180U 240, the DFErst180L 242, the DFErst360U 246, the DFErst360L 248, the DFErst540U 252, and the DFErst540L 254. Each of the DFErst0U 234, the DFErst180U 240, the DFErst360U 246, and the DFErst540U 252 may correspond to a respective reset for DQ phases 76 for "upper" DQs located on a first side of the DFE reset circuitry 54. Similarly, each of the DFErst0L 236, the DFErst180L 242, the DFErst360L 248, and the DFErst540L 254 may correspond to a respective reset for DQ phases 76 for "lower" DQs located on a second side of the DFE reset circuitry 54.

As illustrated, the DFE reset generator 72 may correspond to DFE processing for 8 phases (e.g., 4 phases with copies for upper DQs and lower DQs of DFE). For instance, the upper and lower DQs of the DFE may form a byte. For instance, the byte may be a portion (e.g., half) a prefetch causing two DFE reset generators 72 to be placed in the memory device 10. Additionally or alternatively, the DFE reset generator 72 may correspond to a different number of bits and/or an entire prefetch for the memory device 10.

Regardless of the number of DQ phases 76 driven by the DFE reset generator 72, the DFE reset generator 72 uses the DFE reset enable signal 116 and the timing signals (LastBitm3 140, LastBitm2 142, LastBitm1 144, and LastBitm0 146) created in the interamble DQS counter 70 to generate four-phase DFE reset signals for each DQ. For driving purposes, the reset signals may be split into upper and lower bit signals to reduce driving requirements for each reset signal. In summary, the DFE reset enable signal 116 and the timing signals are used to generate the DlydLastBitm3 182, DlydLastBitm2 184, DlydLastBitm1 186, and DlydLastBitm0 188 that are then used by the DFE reset generator 72 in generating the DFE reset signals.

Figure 7:
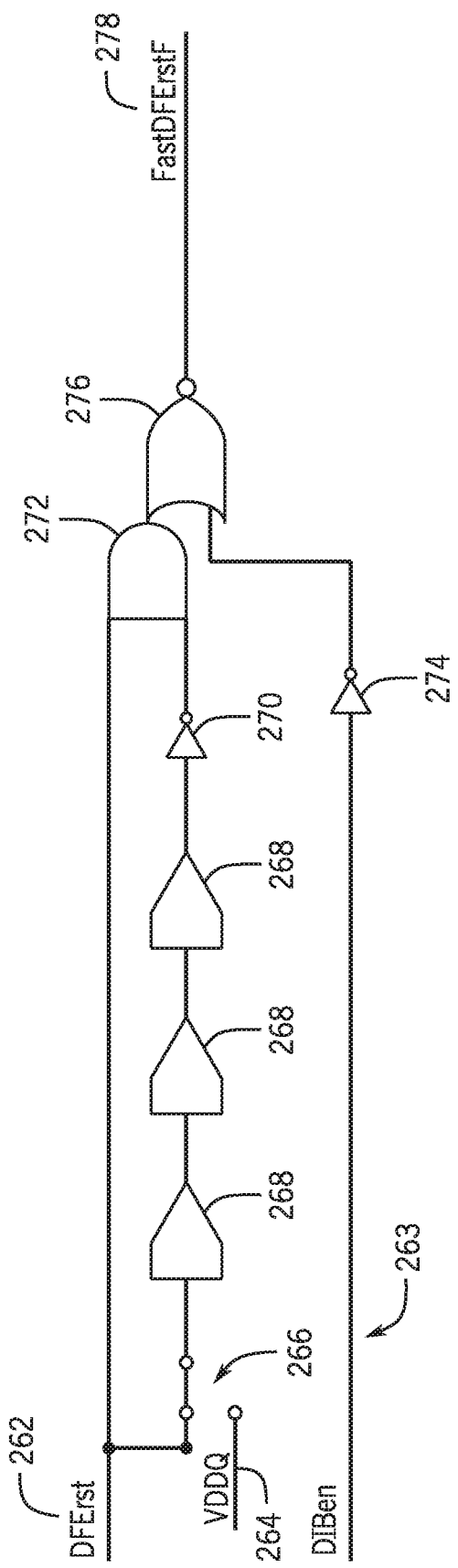
FIG. 7 is a schematic diagram of a buffer and chop circuit, one of which may be located in each DQS phase of the memory device of FIG. 1 to receive a respective DFE reset signal from the reset generator of FIG. 6 to reset the DFE for the DQS phase, in accordance with an embodiment.

FIG. 7 is a circuit diagram of an embodiment of the buffer and chop circuitry 74 in a DQ phase 76. The buffer and chop circuitry 74 receives a DFErst signal 262. For instance, the DFErst signal 262 may be the DFErst0U 234, the DFErst0L 236, the DFErst180U 240, the DFErst180L 242, the DFErst360U 246, the DFErst360L 248, the DFErst540U 252, or the DFErst540L 254 received at the respective buffer and chop circuitry 74 of the respective DQ phase 76. After a write operation, a last write bit may stick in a certain value. The buffer and chop circuitry 74 ensures that the signals are driven well locally while allowing for a wider DFE reset pulse to be transmitted through the DFE reset tree (e.g., spanning four DQs in each direction from the DFE reset circuitry 54 using a data input buffer signal 263). If the data input buffer signal 263 is disabled, the DFE reset becomes persistent until it is enabled again for the next write operation.

The buffer and chop circuitry 74 also includes splits paths of the DFErst signal 262. In one path, the DFErst signal 262 or a logic-high voltage VDDQ 264 is selectively transmitted from a switch 266. VDDQ 264 acts as a disable path for the DFE reset. The switch 266 is coupled to a series of delays 268 that control a width of a pulse of the DFErst signal 262 (when the switch transmits the DFErst signal 262). Specifically, the delays 268 delay the DFErst signal 262 and an inverter 274 inverts the DFErst signal 262. The inverted and non-inverted copies DFErst signals 262 are passed to an AND gate 272 that prevents transmission of a pulse of the DFErst signal 262 for a period longer than a duration set by the series of delays 268. The data input buffer signal 263 is inverted in an inverter 274 and transmitted to a NOR gate 276 that ensures that the DFE reset controlled by a FastDFErstF signal 278 is persistent after a disabling of the data input buffer signal 263 until the data input buffer signal 263 is re-enabled for a next write operation. The FastDFErstF signal 278, when enabled, is used to reset the DFE 52 for the respective DQ phase 76.

FIG. 8 is a graph 300 showing timing of an external DQS and the reset signals from the DFE reset generator 72. The graph 300 includes lines 302, 304, 306, 308, 310, and 312. The line 302 corresponds to an external DQS signal. The line 304 corresponds to the DFE reset enable signal 116. The lines 306, 308, 310, and 312 correspond to respective reset signals. For example, the line 306 may correspond to the DFErst0U 234 or the DFErst0L 236. The line 308 may correspond to the DFErst180U 240 or the DFErst180L 242. The line 310 may correspond to the DFErst360U 246 or the DFErst360L 248. The line 312 may correspond to the DFErst540U 252 or the DFErst540L 254. As illustrated, the lines 306, 308, 310, and 312 do not pulse while the DFE reset enable signal 116 is disabled. At time 314, the DFE reset enable signal 116 is enabled and DQS pauses toggling due to the end of a write operation. Accordingly, the lines 306, 308, 310, and 312 show pulses of their respective reset signals. At time 316, the next write operation ends, and the lines 306, 308, 310, and 312 show resulting pulses. However, a more substantial gap (e.g., 1, 2, 3, or more cycles of DQS) exists between the write operation that ends at time 316 and the write operation that begins at time 318. Accordingly, the DFE resets may be sustained for a period of time as indicated by the lines 306, 308, 310, and 312 that may have a longer pulse. Another pulse of the reset signals occurs after a write operation ends at time 320. Similarly, another sustained pulse of the reset signals occurs after a gap between write operations between time 322 and time 324.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   an interamble data strobe (DQS) counter configured to count cycles between write operations, wherein the interamble DQS counter comprises:
     a decision feedback equalizer (DFE) reset mask circuit configured to generate a DFE reset enable signal; and
     a DFE reset timing generator configured to generate timing signals for the DFE reset;
   a DFE reset generator configured to:
     receive the DFE reset enable signal and the timing signals from the interamble DQS counter;
     use the DFE reset enable signal and the timing signals to generate DFE reset signals for a plurality of DQS phases; and
     transmit the DFE reset signals to the plurality of DQS phases, wherein the DFE reset signals are configured to drive the DFE resetting for a first half of a prefetch for the memory device.

2. The memory device of claim 1, wherein the prefetch comprises 16 bits, and the DFE reset signals are configured to drive DFE resetting for a byte.

3. The memory device of claim 2, comprising a die on which the DFE reset generator is located, wherein the memory device comprises an additional DFE reset generator disposed on the die, wherein the additional DFE reset generator is configured to transmit additional DFE reset signals configured to drive DFE resetting for a second half of the prefetch.

4. The memory device of claim 3, wherein the prefetch comprises 16 bits, the DFE reset signals are configured to drive DFE resetting for a first byte, and the additional DFE reset signals are configured to drive DFE resetting for a second byte.

5. The memory device of claim 1, wherein the memory device is configured to use the interamble DQS counter to block spurious DQS signals that may be generated in an unknown DQS region after a write postamble of a write operation and prior to a write preamble of a subsequent write operation.

6. The memory device of claim 1, wherein the DFE reset generator is located between the plurality of DQS phases.

7. The memory device of claim 6, wherein a first copy of a reset signal of the plurality of DFE reset signals is transmitted to a first DQS phase on a first side of the DFE reset generator, and a second copy of the reset signal is transmitted to a second DQS phase on a second side of the DFE reset generator, wherein the first DQS phase and the second DQS phase correspond to similar phases on opposite sides of the DFE reset generator.

8. The memory device of claim 1, comprising a delay circuit configured to delay the timing signals before use in the DFE reset generator to generate the DFE reset signals.

9. The memory device of claim 8, wherein the DFE reset generator comprises the delay circuit and is configured to selectively delay the timing signals based at least in part on the DFE reset enable signal.

10. A semiconductor device, comprising:
    a centralized decision feedback equalizer (DFE) reset generator configured to:
      generate a plurality of DFE reset signals; and
      transmit the plurality of DFE reset signals to a plurality of data strobe (DQS) phases to control whether to reset respective DFEs of the plurality of DQS phases; and
    a plurality of buffer and chop circuits located in the plurality of DQS phases, wherein each buffer and chop circuit of the plurality of buffer and chop circuits is configured to receive:
      a data input buffer signal to selectively cause persistent enablement of a DFE reset of a respective DFE; and
      a respective DFE reset signal of the plurality of DFE reset signals to selectively reset the respective DFE based at least in part on the respective DFE reset signal.

11. The semiconductor device of claim 10, wherein the centralized DFE reset generator is located between the plurality of DQS phases.

12. The semiconductor device of claim 11, wherein the plurality of DQS phases comprises a first four DQS phases of a first set of data lines (DQs) on a first side of the centralized DFE reset generator and a second four phases of a second set of DQs on a second side of the centralized DFE reset generator.

13. The semiconductor device of claim 10, wherein the centralized DFE reset generator is configured to receive timing signals from an interamble DQS counter.

14. The semiconductor device of claim 13, wherein the centralized DFE reset generator comprises a plurality of NOR gates that each receive a corresponding timing signal and a DFE reset enable signal to generate delayed timing signals and to use the delayed timing signals to generate the DFE reset signals.

15. The semiconductor device of claim 10, wherein each buffer and chop circuitry comprises:
- an input configured to receive the respective DFE reset signal;
- a first path configured to receive a first copy of the respective DFE reset signal and transmit the respective DFE reset signal to an AND gate; and
- a second path configured to:
  - receive a second copy of the respective DFE reset signal;
  - delay the second copy of the respective DFE reset signal through a series of delays;
  - invert the delayed second copy of the respective DFE reset signal; and
  - transmit the inverted and delayed second copy of the respective DFE reset signal to the AND gate.

16. The semiconductor device of claim 15, comprising a switch that is configured to selectively decouple the second path from the respective DFE reset signal and to selectively couple the second path to a logic-high voltage.

17. The semiconductor device of claim 16, comprising a NOR gate configured to receive data input buffer signal and an output of the AND gate and to output a local DFE reset signal.

18. A method, comprising:
- generating a decision feedback equalizer (DFE) reset enable signal and timing signals at an interamble DQS counter;
- transmitting the DFE reset enable signal and the timing signals to a DFE reset generator;
- using the DFE reset generator, generating a DFE reset signal for a plurality of data strobe (DQS) phases of a memory device, wherein a first copy of the DFE reset signal is transmitted to a first DQS phase of the plurality of DQS phases on a first side of the DFE reset generator, and a second copy of the DFE reset signal is transmitted to a second DQS phase of the plurality of DQS phases on a second side of the DFE reset generator, wherein the first DQS phase and the second DQS phase correspond to similar phases on opposite sides of the DFE reset generator; and
- selectively resetting DFEs of the plurality of DQS phases using the DFE reset signal.

19. The method of claim 18, comprising:
- using DFE reset generator to generate additional DFE reset signals for additional DQS phases; and
- selectively resetting DFEs of the additional DQS phases using the additional DFE reset signals.

* * * * *